United States Patent
Shinoda et al.

(10) Patent No.: US 6,912,192 B2
(45) Date of Patent: Jun. 28, 2005

(54) SEMICONDUCTOR LASER UNIT AND OPTICAL HEAD DEVICE

(75) Inventors: Masahisa Shinoda, Nagaokakyo (JP); Kenya Nakai, Nagaokakyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 282 days.

(21) Appl. No.: 10/238,581

(22) Filed: Sep. 11, 2002

(65) Prior Publication Data

US 2003/0231670 A1 Dec. 18, 2003

(30) Foreign Application Priority Data

May 28, 2002 (JP) .......................................... 2002-153799

(51) Int. Cl.[7] .................................................. G11B 7/00
(52) U.S. Cl. .................................. 369/121; 369/112.01
(58) Field of Search .............................. 369/121, 122, 369/44.23, 44.12, 44.37, 112.01, 112.28, 112.29, 103; 372/9, 108

(56) References Cited

U.S. PATENT DOCUMENTS

| | | | |
|---|---|---|---|
| 4,577,941 A | | 3/1986 | Kubota |
| 4,942,584 A | | 7/1990 | Karaki et al. |
| 6,256,272 B1 | | 7/2001 | Yoon |
| 6,480,456 B1 | * | 11/2002 | Kawamura et al. ......... 369/121 |
| 6,657,931 B1 | * | 12/2003 | Hashimoto et al. ...... 369/44.37 |
| 6,785,203 B2 | * | 8/2004 | Maruyama et al. ...... 369/44.23 |
| 6,798,794 B2 | * | 9/2004 | Miyahara ........................ 372/9 |
| 6,807,018 B2 | * | 10/2004 | Maruyama et al. ...... 369/44.23 |
| 6,813,235 B2 | * | 11/2004 | Furuhata et al. ......... 369/44.38 |
| 6,816,450 B2 | * | 11/2004 | Miura et al. ................ 369/121 |
| 2002/0060973 A1 | | 5/2002 | Koichi et al. |

FOREIGN PATENT DOCUMENTS

| | | |
|---|---|---|
| JP | 61-184735 | 8/1986 |
| JP | 02-134735 | 5/1990 |
| JP | 6-274931 A | 9/1994 |
| JP | 2000-251314 | 9/2000 |
| JP | 2000-348369 A | 12/2000 |
| JP | 2001-237501 | 8/2001 |
| JP | 2001-298238 | 10/2001 |
| JP | 2001-331955 A | 11/2001 |
| JP | 2002-025103 | 1/2002 |

\* cited by examiner

*Primary Examiner*—Thang V. Tran
(74) *Attorney, Agent, or Firm*—Birch, Stewart, Kolasch & Birch, LLP

(57) ABSTRACT

A semiconductor laser unit includes a plurality of semiconductor laser elements arranged parallel with one another in a laser beam-emitting direction, and a base for positioning and fixing the plurality of semiconductor laser elements. The plurality of semiconductor laser elements are arranged such that a laser beam emitted from the semiconductor laser element greatest in astigmatism, of the plurality of semiconductor laser elements, is coincident in its axis with a reference axis of the base. In the case that the semiconductor laser unit is arranged on an optical head device, the focusing characteristic on the plurality of laser beams can be improved.

11 Claims, 11 Drawing Sheets

SEMICONDUCTOR LASER UNIT AND OPTICAL HEAD DEVICE

BACKGROUND OF THE INVENTION

1. Technical Field of the Invention

This invention relates to a semiconductor laser unit capable of emitting a plurality of laser beams and an optical head device equipped therewith, and more particularly to a semiconductor laser unit and optical head device improved in the focusing characteristic on the plurality of laser beams.

2. Description of the Related Art

An optical head device has been widely used for recording to or reproducing from an optical disk such as a DVD (Digital Versatile Disc), a CD (Compact Disc) or the like. An optical head device 100 shown in FIG. 10, which is a conventional example, is equipped with a conventional semiconductor laser unit 101 capable of emitting a plurality of laser beams, so-called a multi-beam semiconductor laser unit. A half mirror 102 is arranged on a light-emission side of the semiconductor laser unit 101. A collimator lens 103 and an objective lens 104 are arranged in the order on a light-reflection side of the half mirror 102. At or around a focal spot of the objective lens 104, an optical disk 105 or 106 is arranged to record thereto or reproduce therefrom. Herein, the optical disk 105 is, for example, a DVD which is small in protection layer thickness, while the optical disk 106 is, for example, a CD which is greater in protection layer thickness than a DVD. A photo-detector 107 is arranged on a light-transmission side of the half mirror 102 as viewed from the collimator lens 103.

The semiconductor laser unit 101 used on the optical head device 100 includes a unit shown in JP-A-2001-298238, hereinafter referred to as a first background art. The semiconductor laser unit 101 shown in FIG. 11 as the first background art includes a case 108, a heat block 109 attached on the case 108, a sub-mount 110 arranged on the heat block 109, and a multi-beam semiconductor laser unit 111 arranged on the sub-mount 110. The multi-beam semiconductor laser unit 111 has light-emission points 112 and 113 spaced by approximately 100 microns. The first light-emission point 112 which emits a shorter laser beam in wavelength than the second light-emission point 113 is in a center of an outer shape of the case 108. The semiconductor laser unit 101 is arranged on the optical head device 100 such that the laser beam emitted from the first light-emission point 112 is coincident in its axis with an optical axis 114 of the collimator lens 103 and the objective lens 104 shown in FIG. 10. For example, the light-emission points 112 and 113 emit laser beams at a wavelength of 650 nm for recording to or reproducing from DVD and at a wavelength of 780 nm for recording to or reproducing from CD, respectively.

The laser beam, emitted from the first light-emission point 112 of the semiconductor laser unit 101 shown in FIG. 11, is reflected upon the half mirror 102 shown in FIG. 10, followed by entering the collimator lens 103 where it is converted into a collimated laser beam. Thereafter, this enters the objective lens 104 and is focused onto the optical disk 105. The laser beam reflected upon the optical disk 105 travels through a reverse optical path to pass through the half mirror 102, followed by being irradiated onto the photo-detector 107. In the photo-detector 107, detected are the reproduced signals from the optical disk 105 and the signals required for focusing and tracking. Similarly, the laser beam, emitted from the second light-emission point 113 of the semiconductor laser unit 101, is focused onto the other optical disk 106. In the photo-detector 107, detected are the reproduced signals from the optical disk 106 and the signals required for focusing and tracking.

As for the first light-emission point 112, high-performance focusing characteristic is available without influence of an aberration of the collimator lens 103 and objective lens 104, because the axis of the laser beam emitted from the first light-emission point 112 exists on an optical axis 114. On the other hand, as for the second light-emission point 113, because the axis of the laser beam emitted therefrom dose not exist on the optical axis 114, incidence is oblique on the collimator lens 103 and objective lens 104, thus being unavoidably influenced by an aberration. However, a CD, irradiated by a laser beam longer in wavelength emitted from the second light-emission point 113, has a greater margin than a DVD in respect of wavelength and lens focusing performance, and therefore, there is no significant trouble in practical operation.

JP-A-2002-25103, a second background art, discloses a similar optical head device to the first background art. This shows that, in mounting a semiconductor laser unit having two light-emission points for emitting laser beams of different wavelengths on an optical head device 100, a light-emission point emitting a laser beam of a shorter wavelength (first light-emission point 112) is coincident on an optical axis 114 or arranged so that a distance between the light-emission point emitting a laser beam of a shorter wavelength (first light-emission point 112) and the optical axis 114 may be shorter than a distance between the light-emission point emitting a laser beam of a longer wavelength (second light-emission point 113) and the optical axis 114. In this case, similarly to the first background art, the light-emission point emitting a laser beam of a shorter wavelength (first light-emission point 112) is arranged to a position close to the optical axis 114 with priority over the light-emission point emitting a laser beam of a longer wavelength (second light-emission point 113), because it is readily influenced by an aberration of the collimator lens 103 and the objective lens 104.

In the meanwhile, in the optical head device 100, an astigmatism generally exists on the multi-beam semiconductor laser unit 111 besides the aberration resulting from a positional relationship between the lens system (herein, collimator lens 103 and objective lens 104) and the light-emission point. The astigmatism is preferably suppressed to a possible small extent because it also has an effect upon a focusing characteristic.

JP-A-2000-251314, a third background art, discloses a conventional optical head device shown in FIG. 12, in which references 100 to 107 and reference 114 are the same as those shown in FIG. 10. An astigmatism compensating plate 115 is arranged on an optical path between a semiconductor laser unit 101 and a half mirror 102. The astigmatism compensating plate 115 is in the form of a parallel plate formed of a transparent optical member, such as glass or resin. As shown in FIG. 13, the plane formed by the axes 116 and 117 of the laser beams emitted from two light-emission points 112 and 113, respectively, is on the same plane (X-Z plane in FIG. 13) as the normal line of an incidence surface of the astigmatism compensating plate 115. Also, the astigmatism compensating plate 115 is arranged inclined relative to the plane formed by the axes 116 and 117 of the laser beams.

It is apparent that, in case a divergently emitting laser beam transmits through the parallel-plated astigmatism compensating plate 115 arranged with inclination relative to the axes 116, 117, an astigmatism occurs in the laser beam. The amount of astigmatism occurrence is influenced to a refractive index of an optical member structuring the astigmatism compensating plate 115, parallel plate thickness and an inclination angle in arrangement the astigmatism compensating plate 115. In the case that an astigmatism already exists in the laser beam entering the astigmatism compensating plate 115, added thereto is an astigmatism caused due to the transmission through the astigmatism compensating plate 115. Therefore, a refractive index, thickness and inclination angle of the astigmatism compensating plate 115 are set in a manner to give an astigmatism reverse in direction to and same in magnitude as the amount of the astigmatism existing in the laser beam entering the astigmatism compensating plate 115, so that the astigmatism can be suppressed in the laser beam after transmitted through the astigmatism compensating plate 115. As noted above, because the astigmatism generally exists on the multi-beam semiconductor laser unit 111 itself, it is very effective to adopt such an astigmatism compensating plate 115.

Furthermore, the astigmatism compensating plate 115 applied to the multi-beam semiconductor laser unit 111 also has an effect shown in JP-A-2001-237501, a fourth background art. Namely, for the laser beams different in wavelength emitted from light-emission points 112 and 113, their axes 116 and 117, are refracted at both the incident and exit surfaces of the astigmatism compensating plate 115. Generally, the refractive index of an optical member depends on a wavelength, i.e. increases with decrease in wavelength. Accordingly, the laser beam 116 shorter in wavelength undergoes greater refractive action to have a greater parallel shift amount in the laser beam axis 116 before entering and after exiting from the astigmatism compensating plate 115 than that in the axis 117 of the laser beam longer in wavelength. As shown in FIG. 13, in the case that the astigmatism compensating plate 115 is arranged with inclination in a manner nearing the light-emission point 113 for emitting a laser beam of longer wavelength, the distance B between the axes 116 and 117 of the two laser beams after exiting from the astigmatism compensating plate 115 is smaller than the distance A between the axes 116 and 117 of the two laser beams before entering the astigmatism compensating plate 115. Conversely, in the case that the astigmatism compensating plate 115 is arranged with inclination in a manner nearing the light-emission point 112 for emitting a laser beam of shorter wavelength, the distance B between the axes 116 and 117 of the two laser beams after exiting from the astigmatism compensating plate 115 is greater than the distance A between the axes 116 and 117 of the two laser beams before entering the astigmatism compensating plate 115. In this manner, the distance between the axes 116 and 117 of the two laser beams can be varied to entering and exiting from the astigmatism compensating plate 115 by changing the inclination angle of the astigmatism compensating plate 115. It is accordingly possible to freely adjust a positional relationship between the two light-emission points 112, 113 and the optical axis 114.

However, the conventional semiconductor laser unit 101 and the optical head device 100 equipped therewith have involved the following problems.

In the first and second background arts, the light-emission point 112 for emitting a laser beam shorter in wavelength is arranged on or close to the optical axis 114 in order to preferentially secure the focusing performance, for example, for the DVD strict in aberration condition as compared to the CD. However, there is a problem of sacrificing the focusing performance on a laser beam longer in wavelength emitted from the light-emission point 113.

Meanwhile, the third background art is structured such that the astigmatism existing on the two light-emission points 112, 113 of the multi-beam semiconductor laser unit 111 is compensated by the use of the astigmatism compensating plate 115. Accordingly, in the case that the two light-emission points 112, 113 emit laser beams of the same wavelength and have the same astigmatism each other, compensation can be easily made on the two light-emission points 112, 113. However, where the two light-emission points 112, 113 emit laser beams different in wavelength, they do not necessarily have the same amount of astigmatism, because the materials structuring the light-emission points 112, 113 of the multi-beam semiconductor laser unit 111 are different. Accordingly, there is difficulty in simultaneously compensating the astigmatisms on the two light-emission points 112, 113 where there is difference in the astigmatisms. Thus, further required is means for securing a focusing performance on a light-emission point more insufficient of compensation among the two light-emission points.

Meanwhile, in the fourth background art, the astigmatism compensating plate 115 is arbitrarily inclined to adjust to a desired value the distance B between the axes 116 and 117 of the two laser beams after transmitting through the astigmatism compensating plate 115. However, there occurs variation in the amount of astigmatism of the laser beam after transmitting through the astigmatism compensating plate 115 due to the inclination angle of the astigmatism compensating plate 115. Thus, there is a problem that much time is required in measuring a distance B or in an adjusting process for the astigmatism compensating plate 115.

Furthermore, the first to fourth background arts, in any, merely explain to obtain the optimal focusing characteristic on the optical axis 114 of the collimator lens 103 and the objective lens 104 of the optical head device 100, but are silent in the relationship with a focusing characteristic including an astigmatism occurring on the above lens system. Accordingly, in the viewpoint of strict optical design, there is a problem that structuring is not made to simultaneously optimize the focusing characteristic on the two laser beams.

SUMMARY OF THE INVENTION

The present invention has been made in order to eliminate the foregoing problems, and it is an object thereof to provide a semiconductor laser unit and an optical head device for simultaneously optimizing the focusing characteristic on a plurality of laser beams.

A semiconductor laser unit according to the present invention includes a plurality of semiconductor laser elements arranged parallel with one another in a laser beam-emitting direction, and a base for positioning and fixing the plurality of semiconductor laser elements. The plurality of semiconductor laser elements are arranged such that a laser beam emitted from the semiconductor laser elements greatest in astigmatism, of the plurality of semiconductor laser elements, is coincident in its axis with a reference axis of the base.

In another aspect of the invention, a semiconductor laser unit includes a plurality of semiconductor laser elements arranged parallel with one another in a laser beam-emitting direction, at least two of the plurality of semiconductor laser elements having an astigmatism substantially equal with each other, and a base for positioning and fixing the plurality of semiconductor laser elements. The plurality of semiconductor laser elements are arranged such that axes of laser beams emitted from the at least two semiconductor laser elements sandwich a reference axis of the base and are spaced by a substantially equal distance from the reference axis.

In the case that the semiconductor laser unit is arranged on an optical head device, it is possible to equalize the astigmatism of each focal spot formed on an optical disk regardless of a magnitude of an astigmatism inherently existing on each of the semiconductor laser element.

In still another aspect of the invention, a semiconductor laser unit includes a plurality of semiconductor laser elements arranged parallel with one another in a laser beam-emitting direction, at least two of the plurality of semiconductor laser elements having an astigmatism substantially equal with each other, a base for positioning and fixing the plurality of semiconductor laser elements, and an astigmatism compensator arranged on the base oppositely to a laser beam-emitting surface of the plurality of semiconductor laser elements, to compensate an astigmatism of the at least two semiconductor laser elements. The plurality of semiconductor laser elements are arranged such that axes of laser beams emitted from the at least two semiconductor laser elements, after having transmitted through the astigmatism compensator, sandwich a reference axis of the base and are spaced by a substantially equal distance from the reference axis.

In a further aspect of the invention, a semiconductor laser unit includes a plurality of semiconductor laser elements arranged parallel with one another in a laser beam-emitting direction, the plurality of semiconductor laser elements comprising the first semiconductor laser element greatest in astigmatism and a second semiconductor laser element smaller in astigmatism than the first semiconductor laser element, a base for positioning and fixing the plurality of semiconductor laser elements, and an astigmatism compensator arranged on the base oppositely to a laser beam-emitting surface of the plurality of semiconductor laser elements, to compensate an astigmatism of the second semiconductor laser element. The plurality of semiconductor laser elements are arranged such that a laser beam emitted from the first semiconductor laser element, after having transmitted through the astigmatism compensator, is coincident in its axis with a reference axis of the base.

In a further aspect of the invention, a semiconductor laser unit includes a plurality of semiconductor laser elements arranged parallel with one another in a laser beam-emitting direction, the plurality of semiconductor laser elements including the first semiconductor laser element greatest in astigmatism and a second semiconductor laser element smaller in astigmatism than the first semiconductor laser element, a base positioning and fixing the plurality of semiconductor laser elements, and an astigmatism compensator arranged on the base oppositely to a laser beam emitting surface of the plurality of semiconductor laser elements, to compensate an astigmatism of the first semiconductor laser element. The plurality of semiconductor laser elements are arranged such that a laser beam emitted from the first semiconductor laser element, after having transmitted through the astigmatism compensator, is coincident in its axis with a reference axis of the base.

In the case that the semiconductor laser unit is arranged on an optical head device, each of the astigmatism of focal spots formed on optical disks can be easily made even. Furthermore, the plurality of semiconductor laser elements can be protected from dust or dirt or the oxygen in the air.

An optical head device for recording onto and/or reproducing from an optical medium, according to the present invention, includes a plurality of semiconductor laser elements arranged parallel with one another in a laser beam-emitting direction, an optical lens for irradiating laser beams emitted from the plurality of semiconductor laser elements onto the optical medium, and a photo-detector for detecting a laser beam irradiated onto the optical medium. The plurality of semiconductor laser elements are arranged such that a laser beam emitted from the semiconductor laser element greatest in astigmatism, of the plurality of semiconductor laser elements, is coincident in its axis with an optical axis of the optical lens.

In another aspect of the invention, an optical head device for recording onto and/or reproducing from an optical medium includes a plurality of semiconductor laser elements arranged parallel with one another in a laser beam-emitting direction, at least two of the plurality of semiconductor laser elements having an astigmatism substantially equal with each other, an optical lens for irradiating laser beams emitted from the plurality of semiconductor laser elements onto the optical medium, and a photo-detector for detecting a laser beam irradiated onto the optical medium. The plurality of semiconductor laser elements are arranged such that axes of laser beams emitted from the at least two semiconductor laser elements sandwich an optical axis of the optical lens and are spaced by a substantially equal distance from the optical axis.

It is possible to equalize the astigmatism of each focal spot formed on an optical disk regardless of a magnitude of an astigmatism inherently existing on each of the semiconductor laser element.

In still another aspect of the invention, an optical head device for recording onto and/or reproducing from an optical medium includes a plurality of semiconductor laser elements arranged parallel with one another in a laser beam-emitting direction, at least two of the plurality of semiconductor laser elements having an astigmatism substantially equal with each other, and an astigmatism compensator arranged oppositely to a laser beam-emitting surface of the plurality of semiconductor laser elements, to compensate an astigmatism of the at least two semiconductor laser elements. The optical head device further includes an optical lens for irradiating laser beams transmitted through the astigmatism compensator onto the optical medium, and a photo-detector for detecting a laser beam irradiated onto the optical medium. The plurality of semiconductor laser elements are arranged such that axes of laser beams emitted from the at least two semiconductor laser elements, after having transmitted through the astigmatism compensator, sandwich an optical axis of the optical lens and are spaced by a substantially equal distance from the optical axis.

In a further aspect of the invention, an optical head device for recording onto and/or reproducing from an optical medium includes a plurality of semiconductor laser elements arranged parallel with one another in a laser beam-emitting direction, the plurality of semiconductor laser elements comprising the first semiconductor laser element greatest in astigmatism and a second semiconductor laser element smaller in astigmatism than the first semiconductor laser element, and an astigmatism compensator arranged oppositely to a laser beam emitting surface of the plurality of semiconductor laser elements, to compensate astigmatism of the second semiconductor laser element. The optical head device further includes an optical lens for irradiating a laser beam transmitted through the astigmatism compensator onto the optical medium, and a photo-detector for detecting a laser beam irradiated onto the optical medium. The plurality of semiconductor laser elements are arranged such that a laser beam emitted from the first semiconductor laser element, after having transmitted through the astigmatism compensator, is coincident in its axis with an optical axis of the optical lens.

In a further aspect of the invention, an optical head device for recording onto and/or reproducing from an optical medium includes a plurality of semiconductor laser elements arranged parallel with one another in a laser beam-emitting direction, the plurality of semiconductor laser elements including the first semiconductor laser element greatest in astigmatism and a second semiconductor laser element smaller in astigmatism than the first semiconductor laser element, and an astigmatism compensator arranged oppositely to a laser beam emitting surface of the plurality of semiconductor laser elements, to compensate astigmatism of the first semiconductor laser element. The optical head device further includes an optical lens for irradiating a laser beam transmitted through the astigmatism compensator onto the optical medium, and a photo-detector for detecting a laser beam irradiated onto the optical medium. The plurality of semiconductor laser elements are arranged such that a laser beam emitted from the first semiconductor laser element, after having transmitted through the astigmatism compensator, is coincident in its axis with an optical axis of the optical lens.

Each of the astigmatism of focal spots formed on optical disks can be easily made even. Furthermore, the plurality of semiconductor laser elements can be protected from dust or dirt or the oxygen in the air.

DETAILED DESCRIPTION OF THE PREFERRED EMBODIMENTS

The invention will now be explained in detail with reference to the drawings showing the embodiment thereof.

Embodiment 1

Figure 1:
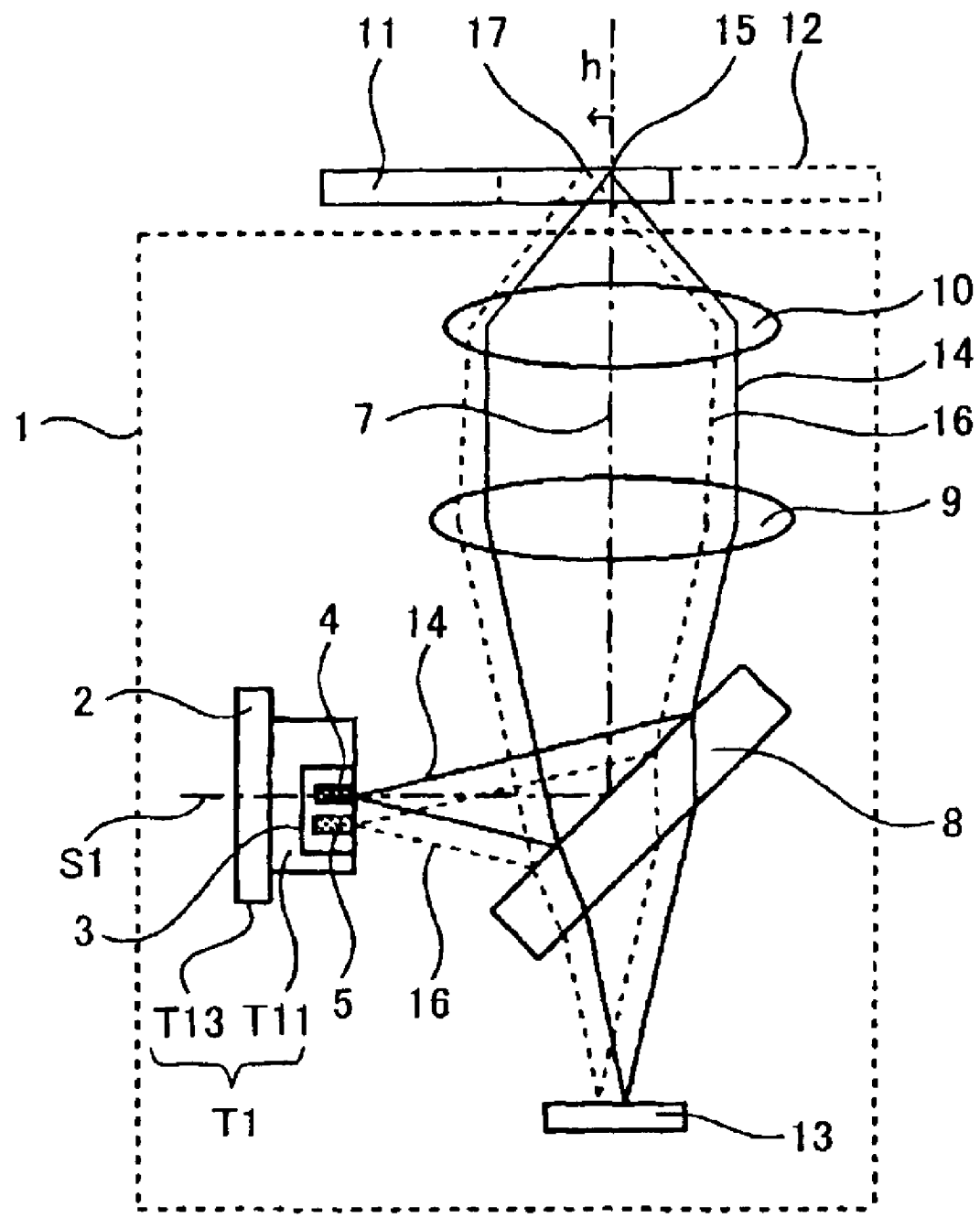
FIG. 1 is a structural view of a semiconductor laser unit and optical head device of Embodiment 1.

In FIG. 1, an optical head device 1 is for recording onto and reproducing from an optical medium. A semiconductor laser unit 2 is capable of emitting a plurality of laser beams, showing herein a unit mounted with a monolithically integrated multi-beam semiconductor laser unit 3. The multi-beam semiconductor laser unit 3 includes semiconductor laser elements 4 and 5.

The semiconductor laser elements 4 and 5 emit laser beams 14 and 16, respectively. A half mirror 8 is arranged on a light-emission side of the semiconductor laser unit 2. A collimator lens 9 and an objective lens 10 are arranged in this order on a light reflection side of the half mirror 8. An optical axis 7 of the objective lens 10 is usually coincident with an optical axis of the collimator lens 9. Optical disks (optical media) 11 and 12 are arranged substantially at a focal spot of the objective lens 10. The laser beams 14 and 16 are focused at focal spots 15 and 17 on optical disks 11 and 12, respectively. A photo-detector 13 is arranged on a light transmission side of the half mirror 8 as viewed from the collimator lens 9, to detect each of reflection lights of the laser beams 14, 16 reflected by the optical disks 11, 12.

Figure 2:
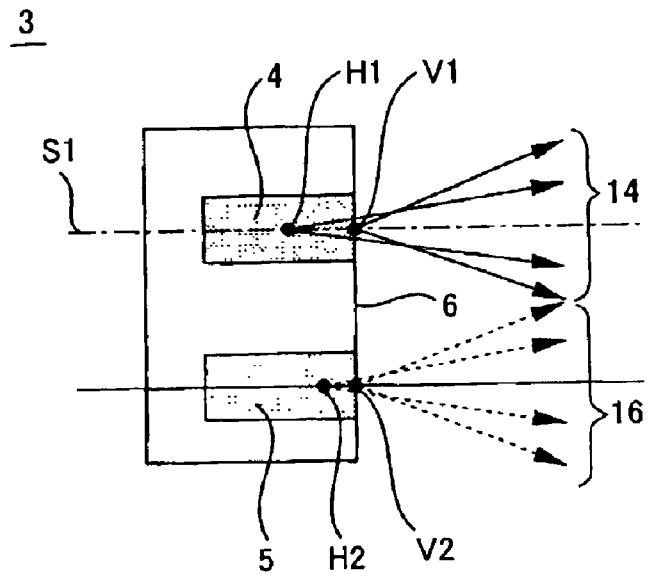
FIG. 2 is a sectional view of a multi-beam semiconductor laser unit of Embodiment 1.

In FIGS. 1 and 2, the semiconductor laser elements 4 and 5 structuring the multi-beam semiconductor laser unit 3 are arranged parallel with each other in direction of emitting laser beams 14 and 15. A base, T1 is arranged for positioning and fixing the multi-beam semiconductor laser unit 3, while S1 is a reference axis of the base T1. A block T11 is for holding the multi-beam semiconductor laser unit 3, and a stem T13 is for fixing the block T11, which is usually in the form of a circular or square cylinder. The block T11 and the stem 13 structure the base T11. The reference axis S1 of the base T1 is an axis previously determined such that, when the semiconductor laser unit 2 is arranged on the optical head device 1, the reference axis S1 is coincident with an optical axis 7 of the objective lens 10 or its extension axis (in FIG. 1, the optical axis 7 is reflected by the half mirror 8). For example, in the case that the stem T13 of the semiconductor laser unit 2 is in a circular cylinder, the reference axis S1 is in usual an axis of the circular cylinder. The outer shape of the semiconductor laser unit 2 is determined such that the reference axis S1 of the base T1 is coincident with the optical axis 7 of the objective lens 10 or its extension axis.

In FIG. 2, vertical light-emission points V1 and V2 (vertical to a widthwise direction of the active layer) usually exist just on a light-emission end face 6 of the semiconductor laser elements 4 and 5, and horizontal light-emission points H1 and H2 (widthwise of the active layer) usually exist inward by several to ten and several microns thereof. The characteristic is called as astigmatism that each semiconductor laser element 4, 5 has vertical and horizontal light-emission points that are not in coincidence with each other. Note that the astigmatism of each semiconductor laser element 4, 5 can be measured by near-field image observation generally known by a person skilled in the art.

In Embodiment 1, the astigmatism existing on the semiconductor laser element 4 is assumably greater as compared to that of the semiconductor laser element 5. As shown in FIGS. 1 and 2, the semiconductor laser elements 4, 5 structuring the semiconductor laser unit 3 are arranged such that the laser beam 14 emitted from the semiconductor laser element 4 greater in astigmatism is coincident in its axis with the reference axis S1 of the base T1. Because the reference axis S1 of the base T1 is coincident with the optical axis 7 of the objective lens 10 or its extension axis in arranging the semiconductor laser unit 2 on the optical head device 1, the laser beam 14 emitted from the semiconductor laser element 4 greater in astigmatism is coincident in its axis with the optical axis 7 of the objective lens 10.

Explanation will now be made on the operation of the optical head device 1 of Embodiment 1. The laser beam 14, emitted from the semiconductor laser element 4 greater in astigmatism of the semiconductor laser unit 2, is reflected upon the half mirror 8 and enters the collimator lens 9 where it is converted into a collimated laser beam and then enters the objective lens 10, thus being focused onto the optical disk 11. At this time, a focal spot 15 is formed on an optical axis 7 of the objective lens 10 of the optical head device 1. The laser beam 14 reflected upon the optical disk 11 travels through a reverse optical path and passes through the half mirror 8, then being irradiated onto the photo-detector 13. In the photo-detector 13, detected are a reproduced signal of the optical disk 11 and the signals required for focusing and tracking.

Similarly, the laser beam 16, emitted from the semiconductor laser element 5 smaller in astigmatism of the semiconductor laser unit 2, enters the objective lens 10 with inclination relative to the optical axis 7 thereof, then being focused onto the optical disk 12. At this time, a focal spot 17 is formed at a point shifted by h from the optical axis 7. Generally, the shift amount h from the optical axis 7 is called an image height. The laser beam 16 reflected upon the optical disk 12 similarly passes through a reverse optical path and transmits through the half mirror 8, being irradiated to the photo-detector 13. In the photo-detector 13, detected are a reproduced signal of the optical disk 12 and the signals required for focusing and tracking.

Of the two focal spots 15 and 17, the focal spot 15 is formed on the optical axis 17 of the objective lens 10 whereas the other focal spot 17 is formed off the optical axis 7. In such a case, the two focal spots 15 and 17 are different in focal state due to so-called an image height characteristic of the objective lens 10. This will be explained using FIG. 3.

Figure 3:
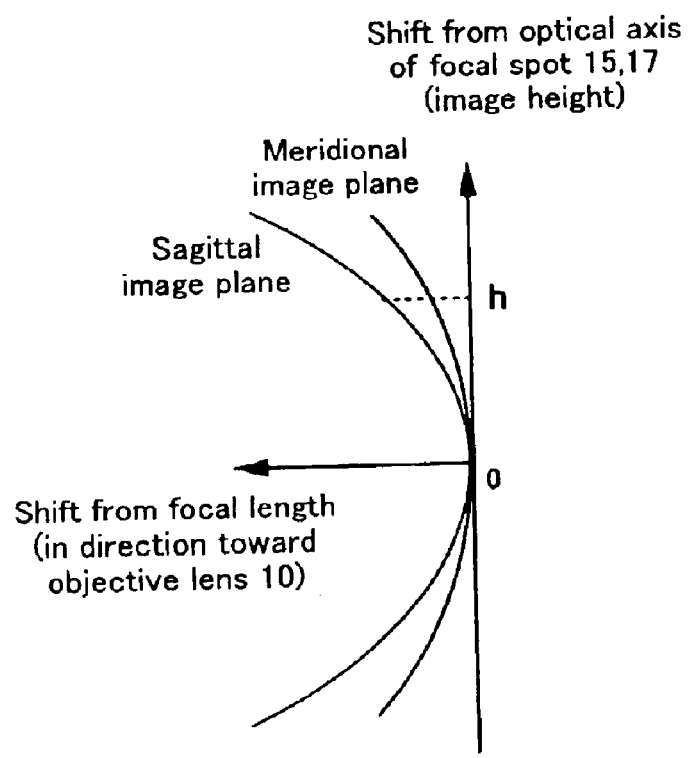
FIG. 3 is an image height characteristic diagram of an objective lens.

In FIG. 3, a shift from a focal spot of the objective lens 10 is taken on the horizontal axis, while a shift amount of each focal spot 15, 17 from the optical axis 7, i.e. image height, is taken on the vertical axis. The focal length of the objective lens 10 is dependent upon a direction of each the laser beam 14, 16 incident on the objective lens 10, and optically structured with a sagittal image plane and a meridional image plane. Herein, in the arrangement of the multi-beam semiconductor laser unit 3 shown in FIG. 2, each of the laser beams 14, 16 emitted from the vertical light-emission points V1, V2 and the horizontal light-emission points H1, H2 is focused on the sagittal image plane and the meridional image plane, respectively. In the case of an image height of zero, i.e. the laser beam 14 focused on the optical axis 7, the focal length is coincident between the sagittal image plane and the meridional image plane. In the case of the other laser beam 16, the focal length on both the sagittal and meridional image planes moves toward the objective lens 10, and the moving amount of the meridional image plane is greater than that of the sagittal image plane. This means that, even if the semiconductor laser elements 4, 5 itself do not have an astigmatism, an astigmatism occurs on the focal spots 15, 17 where the laser beams 14, 16 are focused off the optical axis 7 of the objective lens 10.

As shown in FIG. 2, the semiconductor laser elements 4, 5 have horizontal light-emission points H1, H2 positioned farther than the vertical light-emission points V1, V2 as viewed from the objective lens 10. The laser beam 14 propagated from the light-emission point H1, V1, which is coincident in its axis with the optical axis 7, is not influenced by an image height characteristic in the objective lens 10. However, the laser beam 16 propagated from the light-emission point H2, V2, the axis of which is positioned off the optical axis 7, undergoes in addition to the astigmatism at the light-emission point H2, V2, the effect of an astigmatism in the same direction in compliance with the image height characteristic on the objective lens 10. Consequently, in order to equalize the astigmatism characteristics at the two focal spots 15, 17, there is a need to arrange the semiconductor laser elements 4, 5 such that the laser beam 14 emitted from the semiconductor laser element 4 greater in the astigmatism is coincident in its axis with the optical axis 7, while the axis of the laser beam 16 emitted from the semiconductor laser element 5 smaller in the astigmatism is off the optical axis 7.

Incidentally, although the above explained the relationship between the image height characteristic of the objective lens 10 and the arrangement of the semiconductor laser elements 4, 5, an image height characteristic exists also on the collimator lens 9. However, in the optical system in the optical head device 1, the longitudinal magnification calculated from a focal length of the collimator lens 9 and objective lens 10 is sufficiently smaller than 1. For this reason, the contribution by the image height characteristic possessed by the collimator lens 9 is negligibly small, and therefore, it is satisfactory to discuss on the objective lens 10.

Although Embodiment 1 showed the case with two semiconductor laser elements structuring the multi-beam semiconductor laser unit 3, they may be three or more in the number. In such a case, arrangement of a plurality of semiconductor laser elements may be made such that the laser beam emitted from a semiconductor laser element greatest in astigmatism of these semiconductor laser elements is coincident in its axis with the reference axis S1 of the base T1, i.e. with the optical axis 7 of the objective lens 10.

Embodiment 2

Although Embodiment 1 shows the case that the semiconductor laser element 4 has an astigmatism greater as compared to that of the semiconductor laser element 5, Embodiment 2 shows a case that the two semiconductor laser elements are equal in astigmatism.

Figure 4:
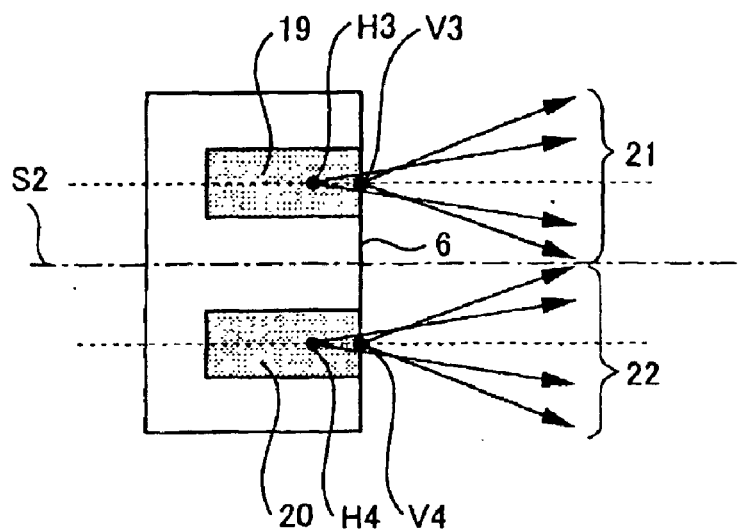
FIG. 4 is a sectional view of a multi-beam semiconductor laser unit of Embodiment 2.

In FIG. 4, semiconductor laser elements 19 and 20 structure the multi-beam semiconductor laser unit 18. Vertical light-emission points V3 and V4 usually exist on light-emission end face 6 of the semiconductor laser elements 19 and 20, respectively. Herein, horizontal light-emission points H3 and H4 exist inward by the same distance from the light-emission end face 6 of the semiconductor laser elements 19 and 20, respectively, and accordingly, the two semiconductor laser elements 19 and 20 are equal in astigmatism. The laser beams 21 and 22 are emitted from the two semiconductor laser elements 19 and 20, respectively.

In Embodiment 2, the semiconductor laser elements 19, 20 equal in astigmatism are arranged such that the axes of the laser beams 21 and 22 sandwich a reference axis S2 of a base and are spaced by an equal distance from the reference axis S2. Similarly to Embodiment 1, when the semiconductor laser unit 18 is arranged on the optical head device 1, the reference axis S2 of the base is coincident with the optical axis 7 of the objective lens 10 or its extension axis. As a result, the multi-beam semiconductor device 18 is arranged such that the axes of the laser beams 21, 22 emitted from the two semiconductor laser elements 19, 20 sandwich the axis 7 of the objective lens 10 and are spaced by an equal distance from the optical axis 7.

In the case of arranging a semiconductor laser unit 2 having such a multi-beam semiconductor laser unit 18 on the optical head device 1 shown in FIG. 1, the image height characteristic on the objective lens 10 exhibits axis-symmetry about the optical axis 7 as shown in FIG. 3. Accordingly, when the laser beams 21, 22 emitted from the semiconductor laser elements 19, 20 are focused on the optical disks 11, 12, the respective focal spots have the equal image height, so that equal astigmatism characteristic is exhibited and focusing characteristic evenness is held.

Although Embodiment 2 shows the case with two semiconductor laser elements structuring the multi-beam semiconductor laser unit 18, they may be three or more in the number. In such a case, the semiconductor laser elements are arranged such that the axes of the laser beams emitted from at least two semiconductor laser elements having an astigmatism equal with each other sandwich the reference axis S2 of the base and are spaced by an equal distance from the reference axis S2, i.e. sandwich the optical axis 7 of the objective lens 10 and are spaced by an equal distance from the optical axis 7.

Embodiment 3

Figure 5:
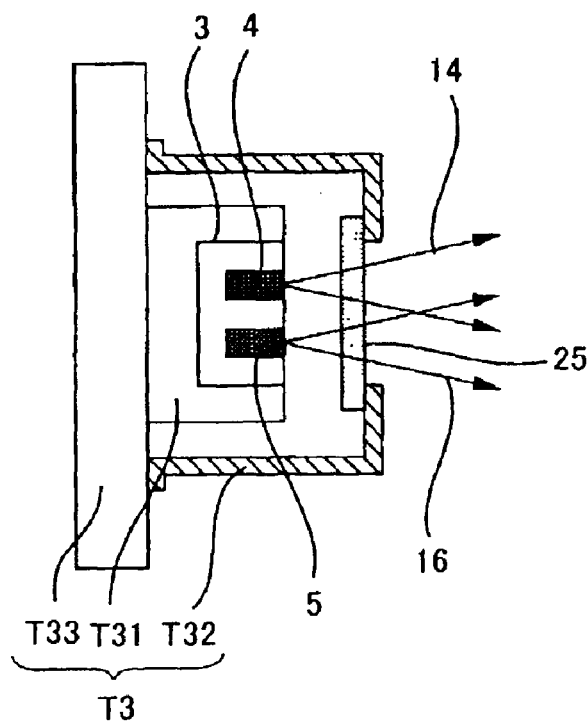
FIG. 5 is a sectional view of a semiconductor laser unit of Embodiment 3.

In FIG. 5 showing a semiconductor laser unit 23 according to Embodiment 3, the references 3 to 5, 14 and 16 are the same as those shown in FIG. 1. A base T3 is for positioning and fixing a multi-beam semiconductor laser unit 3. A block T31 is for holding the multi-beam semiconductor laser unit 3, a case T32 for protecting the multi-beam semiconductor laser unit 3, and a stem T33 for fixing the block 31 and the case T32, respectively. The block T31, the case T32 and the stem T33 structure the base T3. A cover glass 25 in a parallel plate form is fixed on the case T32 oppositely to and parallel with an emitting surface of the laser beams 14, 16 emitted from the semiconductor laser elements 4, 5 structuring the multi-beam semiconductor laser unit 3. As the cover glass 25, a synthetic-resin-made one or the like can also be used instead of a glass-made one, provided that it is a light transmissive member in a parallel plate form.

Next, operation will be explained. The laser beams 14, 16 respectively emitted from the semiconductor laser elements 4, 5 transmit through the cover glass 25. The cover glass 25 is arranged oppositely to the laser beam-emitting surface of the semiconductor laser elements 4, 5 and in the form of a parallel plate. This, accordingly, has no effect of astigmatism upon the laser beams 14, 16 emitted from the semiconductor laser elements 4, 5 and serves to protect the multi-beam semiconductor laser unit 3 from dust and dirt. Furthermore, in the case of the semiconductor laser elements 4, 5 to be possibly deteriorated depending on its material by the oxygen in the air, the cover glass 25 and the case T32 are arranged to shield and protect the semiconductor laser elements 4, 5 from the air. After transmitting through the cover glass 25, the laser beams 14, 16 travel toward the half mirror 8 similarly to the case shown in Embodiment 1.

Although Embodiment 3 shows the case using the multi-beam semiconductor laser unit 3 having the semiconductor laser elements 4, 5 shown in Embodiment 1, the cover glass 25 used in Embodiment 3 may also be applied to a multi-beam semiconductor laser unit 18 having the semiconductor laser elements 19, 20 shown in Embodiment 2.

Embodiment 4

Figure 6:
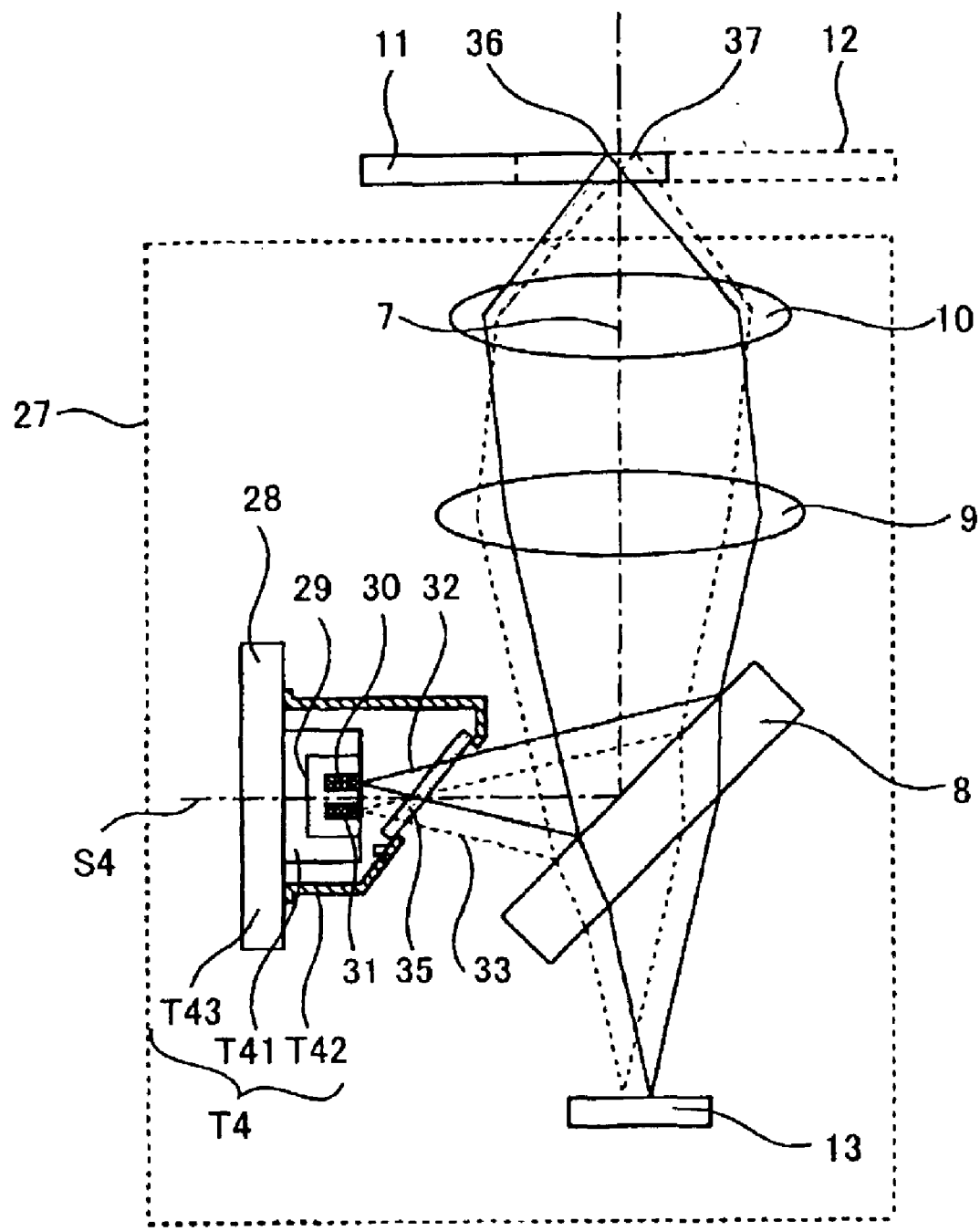
FIG. 6 is a structural view of a semiconductor laser unit and optical head device of Embodiment 4.

In FIG. 6, references 7 to 13 are the same as those shown in FIG. 1. In an optical head device 27 shown in FIG. 6, a semiconductor laser unit 28 is capable of emitting a plurality of laser beams, showing herein a unit mounted with a monolithically integrated multi-beam semiconductor laser unit 29. The multi-beam semiconductor laser unit 29 includes semiconductor laser elements 30 and 31. Herein, the two semiconductor laser elements 30 and 31 have the same astigmatism.

The laser beams 32 and 33 are emitted from the semiconductor laser elements 30 and 31, respectively. The laser beams 32, 33 are focused at focal spots 36, 37 on the optical disks 11, 12.

Figure 7:
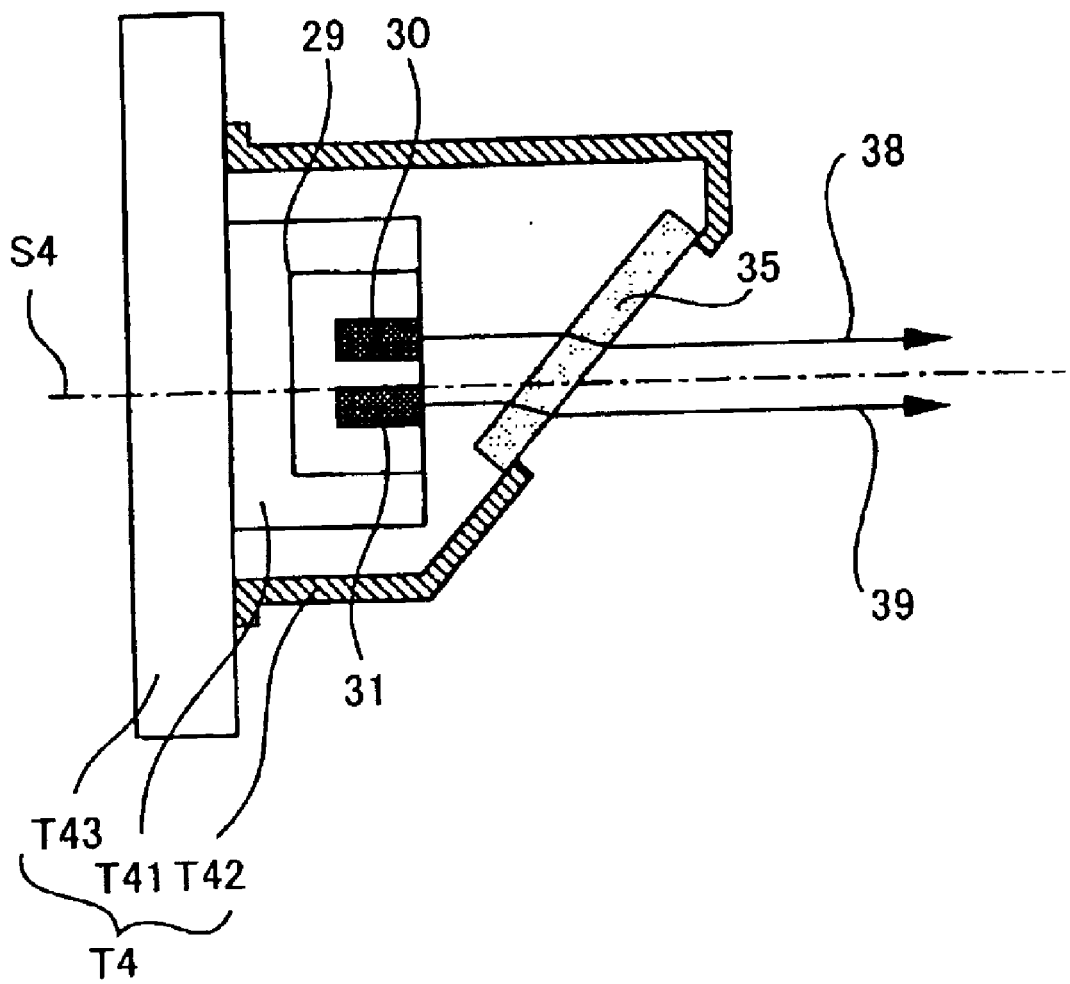
FIG. 7 is a sectional view of a semiconductor laser unit of Embodiment 4.

In FIGS. 6 and 7, the semiconductor laser elements 30 and 31 structuring the multi-beam semiconductor laser unit 29 are arranged parallel with each other in direction of emitting the laser beams 32 and 33. A base T4 is for positioning and fixing the multi-beam semiconductor laser unit 29, and S4 is a reference axis of the base T4. A block T41 is for holding the multi-beam semiconductor laser unit 29, a case T42 for protecting the multi-beam semiconductor laser unit 29, and a stem T43 for fixing the block T41 and the case T42. The block T41, the case T42 and the stem T43 structure the base T4.

A cover glass 35 in a parallel plate form is fixed to the case T42 of the base T4, with inclination relative to and oppositely to the laser beam-emitting surface of the laser beams 32, 33 of the semiconductor laser elements 30, 31. The material reflective index and thickness of the cover glass 35 and the inclination angle to the laser beam-emitting surface for the laser beams 32, 33 are determined to cancel the astigmatism inherently existing on the two semiconductor laser elements 30, 31. The cover glass 35 may be a synthetic-resin light transmissive member besides a glass-made one provided that it can compensate the astigmatism on the two semiconductor laser elements 30, 31. It is possible to use a cylindrical lens, a hologram, a Fresnel lens, a coupling lens or the like.

The laser beams 32, 33 have the axes 38 and 39 after transmission through the cover glass 35, respectively. The multi-beam semiconductor laser unit 29 is arranged such that the axes 38, 39 sandwich a reference axis S4 of the base T4 and are spaced by the equal distance from the reference axis S4. The semiconductor laser unit 28 is defined in its outer shape such that the reference axis S4 of the base T4 is coincident with the optical axis 7 of the objective lens 10 or its extension axis. Accordingly, the multi-beam semiconductor laser unit 29 is arranged such that the axes 38, 39 of the laser beams 32, 33 after transmission through cover glass 35 sandwich the optical axis 7 of the objective lens 10 and are spaced by the equal distance from the optical axis 7.

Explanation will be now made on the operation of the optical head device 27 of Embodiment 4. The laser beams 32, 33 emitted from the semiconductor laser elements 30, 31 transmit through the cover glass 35. The same astigmatism existing on the two semiconductor laser elements 30, 31 are canceled by the transmission through the cover glass 35 to propagate laser beams 32, 33 compensated in astigmatism. Furthermore, the cover glass 35, together with the case T42, protects the multi-beam semiconductor laser unit 3 from the dust and dirt or oxygen in the air.

After transmitting through the cover glass 35, the laser beams 32, 33 have the axes 38, 39 sandwiching the reference axis S4 of the base T4 and spaced by the equal distance from the reference axis S4, i.e. sandwiching the optical axis 7 of the objective lens 10 and spaced by the equal distance from the optical axis 7. They are then focused by the objective lens 10 to form focal spots 36, 37. Because the two focal spots 36, 37 have an image height equal to each other, they equally undergo the effect of the image height characteristic of the objective lens 10 shown in FIG. 3, maintaining the evenness in focusing characteristic.

Although Embodiment 4 shows the case of two semiconductor laser elements structuring the multi-beam semiconductor laser unit 29, they may be three or more in the number. In such a case, the plurality of semiconductor laser elements are arranged such that axes of laser beams emitted from the at least two semiconductor laser elements having an astigmatism equal with each other after having transmitted through the cover glass 35 sandwich the reference axis S4 of the base T4 and are spacing by an equal distance from the reference axis S4, i.e. sandwich the optical axis 7 of the objective lens 10 and are spaced by an equal distance from the optical axis 7.

Embodiment 5

Figure 8:
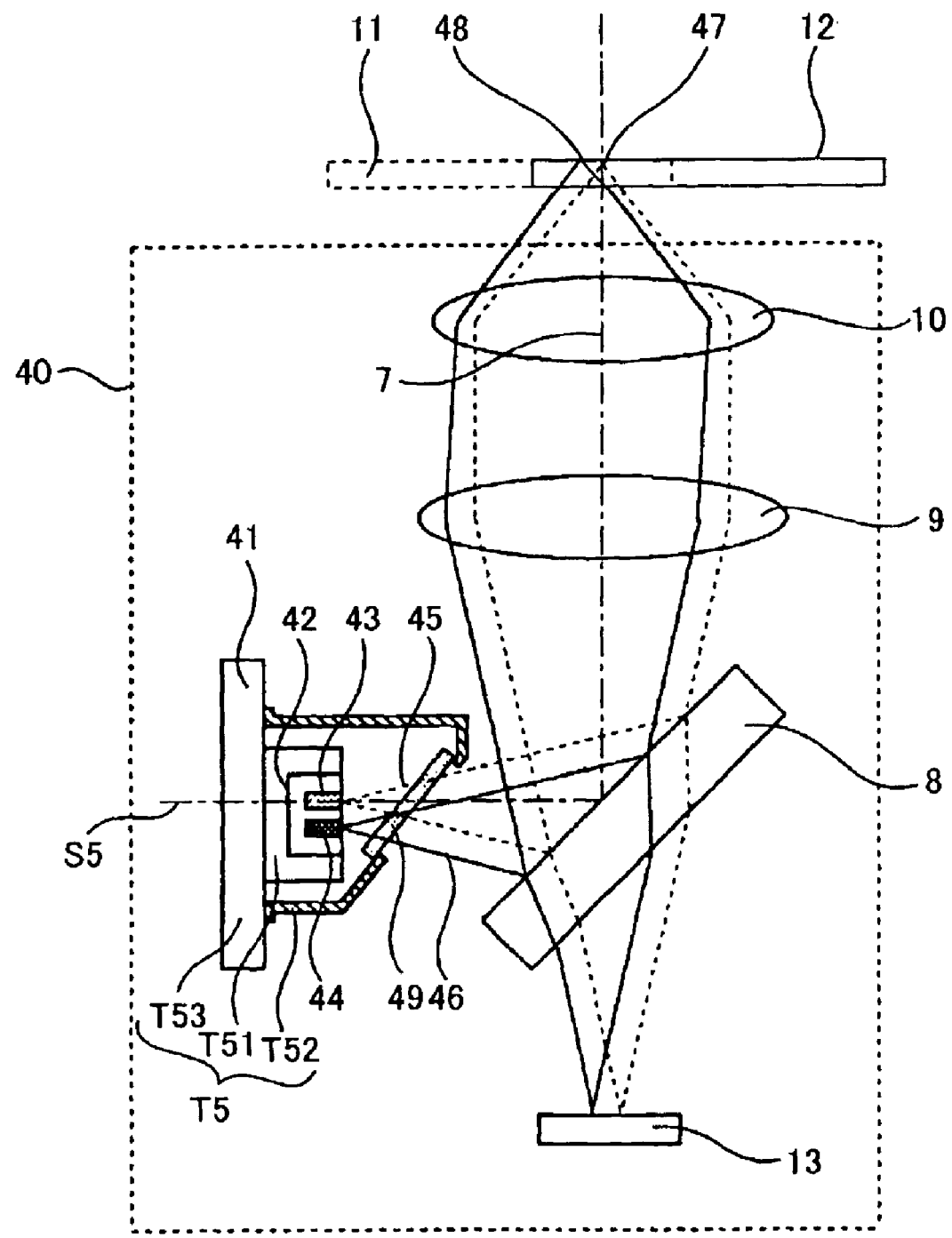
FIG. 8 is a structural view of a semiconductor laser unit and optical head device of Embodiment 5.

In FIG. 8, references 7 to 13 are similar to those shown in FIG. 1. The optical head device 40 of Embodiment 5 includes a semiconductor laser unit 41 capable of emitting a plurality of laser beams, showing herein a unit mounted with a monolithically integrated multi-beam semiconductor laser unit 42. The multi-beam semiconductor laser unit 42 is structured by semiconductor laser elements 43 and 44. Of the two semiconductor laser elements 43, 44, the semiconductor laser element 43 has an astigmatism greater than that of the semiconductor laser element 44.

In FIG. 8, laser beams 45, 46 are emitted from the semiconductor laser elements 43, 44, respectively. The semiconductor laser elements 43 and 44 structuring the multi-beam semiconductor laser unit 42 are arranged such that the laser beams 45 and 46 are parallel with each other in a laser beam-emitting direction. A base T5 is for positioning and fixing the multi-beam semiconductor laser unit 42, while S5 is a reference axis of the base T5. A block T51 is for holding the multi-beam semiconductor laser unit 42, a case T52 for protecting the multi-beam semiconductor laser unit 42, and a stem T53 for fixing the block T51 and the case T52, respectively. The block T51, the case T52 and the stem T53 structure the base T4.

A cover glass 49 in a parallel plate form is fixed on the case T52 of the base T5, with inclination relative to a laser beam-emitting surface for the laser beams 45, 46 emitted from the semiconductor laser elements 43, 44. The reflective index and thickness of the cover glass 49 and the inclination angle to the laser beam-emitting surface for laser beams 45, 46 are set to cancel the astigmatism inherently existing on the semiconductor laser element 44. The cover glass 49 may be a synthetic-resin light transmissive member besides a glass-made one provided that it can compensate the astigmatism on the semiconductor laser element 44 smaller in astigmatism. It is possible to use a cylindrical lens, a hologram, a Fresnel lens, a coupling lens or the like.

The multi-beam semiconductor laser unit 42 is arranged such that the axis of the laser beam 45 emitted from the semiconductor laser element 43 greater in astigmatism after transmitted through the cover glass 49, is coincident with the reference axis S5 of the base T5. The semiconductor laser unit 41 is defined in its outer shape such that the reference axis S5 of the base T5 is coincident with the optical axis 7 of the objective lens 10 or its extension axis. Accordingly, the multi-beam semiconductor device 42 is arranged such that the axis of the laser beam 45 after transmitted through the cover glass 49 is coincident with the optical axis of the objective lens 10.

The laser beams 45, 46 are focused at the focal spots 47, 48 on the optical disks 11, 12, respectively. In the case that the laser beam 45 emitted from the semiconductor laser element 43 greater in astigmatism is focused on the optical disk 11, the focal spot 47 is formed just on the optical axis 7 of the objective lens 10. On the other hand, the laser beam 46 emitted from the semiconductor laser element 44 smaller in astigmatism is focused on the optical disk 12, formed is a focal spot 48 having an image height.

Explanation will now be made on the operation of the optical head device 40 of Embodiment 5. The laser beams 45, 46 respectively emitted from the semiconductor laser elements 43, 44 transmit through the cover glass 49. The astigmatism existing on the semiconductor laser element 44 smaller in astigmatism is canceled by transmission through the cover glass 49, to propagate a laser beam 46 compensated in astigmatism. Furthermore, the cover glass 49, together with the cover T52, serves to protect the multi-beam semiconductor laser unit 42 from dust and dirt or the oxygen in the air. Because the axis of the laser beam 46 after transmitted through the cover glass 49 is not coincident with but out of the optical axis 7, it is focused having an image height by the objective lens 10 to form a focal spot 48. Because the focal spot 48 undergoes the effect of an image height characteristic of the objective lens 10 shown in FIG. 3, it is turned into a spot newly having an astigmatism.

On the other hand, because the astigmatism existing on the semiconductor laser element 43 is greater than that on the semiconductor laser element 44, the astigmatism is not completely canceled by the light transmission through the cover glass 49, to propagate a laser beam 45 having an astigmatism partly remained. This laser beam 45 is coincident in its axis with the optical axis 7, and therefore, it is focused without the influence of an image height characteristic of the objective lens 10.

In this manner, as for the laser beam 46 emitted from the semiconductor laser element 44 smaller in astigmatism, because of propagation at an axis off the optical axis 7, an astigmatism newly occurs due to the image height characteristic of the objective lens 10. However, the astigmatism possessed by the semiconductor laser element 43 is suppressed by the cover glass 49. Meanwhile, as for the laser beam 45 emitted from the semiconductor laser element 43 greater in astigmatism, the astigmatism cannot be completely compensated by the cover glass 49. However, because of propagation at an axis just on the optical axis 7, no astigmatism newly occurs due to the image height characteristic of the objective lens 10. Accordingly, there is no increase in the astigmatism difference between the laser beams 45 and 46. There is no possibility that one of the focal spots 47, 48 is greatly deteriorated in focusing characteristic, thus maintaining evenness in focusing characteristic.

Although Embodiment 5 shows the case of two semiconductor laser elements structuring the multi-beam semiconductor laser unit 42, they may be three or more in the number. In such a case, the semiconductor laser elements are arranged such that the axis of the laser beam emitted from the semiconductor laser element greatest in astigmatism of the semiconductor laser elements in plurality is coincident with the reference axis S5 of the base T5, i.e. coincident with the optical axis 7 of the objective lens 10. Furthermore, for the semiconductor laser element having a smaller astigmatism than that, preferably for the semiconductor laser element second greatest in astigmatism, used is a cover glass 49 for compensating the astigmatism.

Embodiment 6

Figure 9:
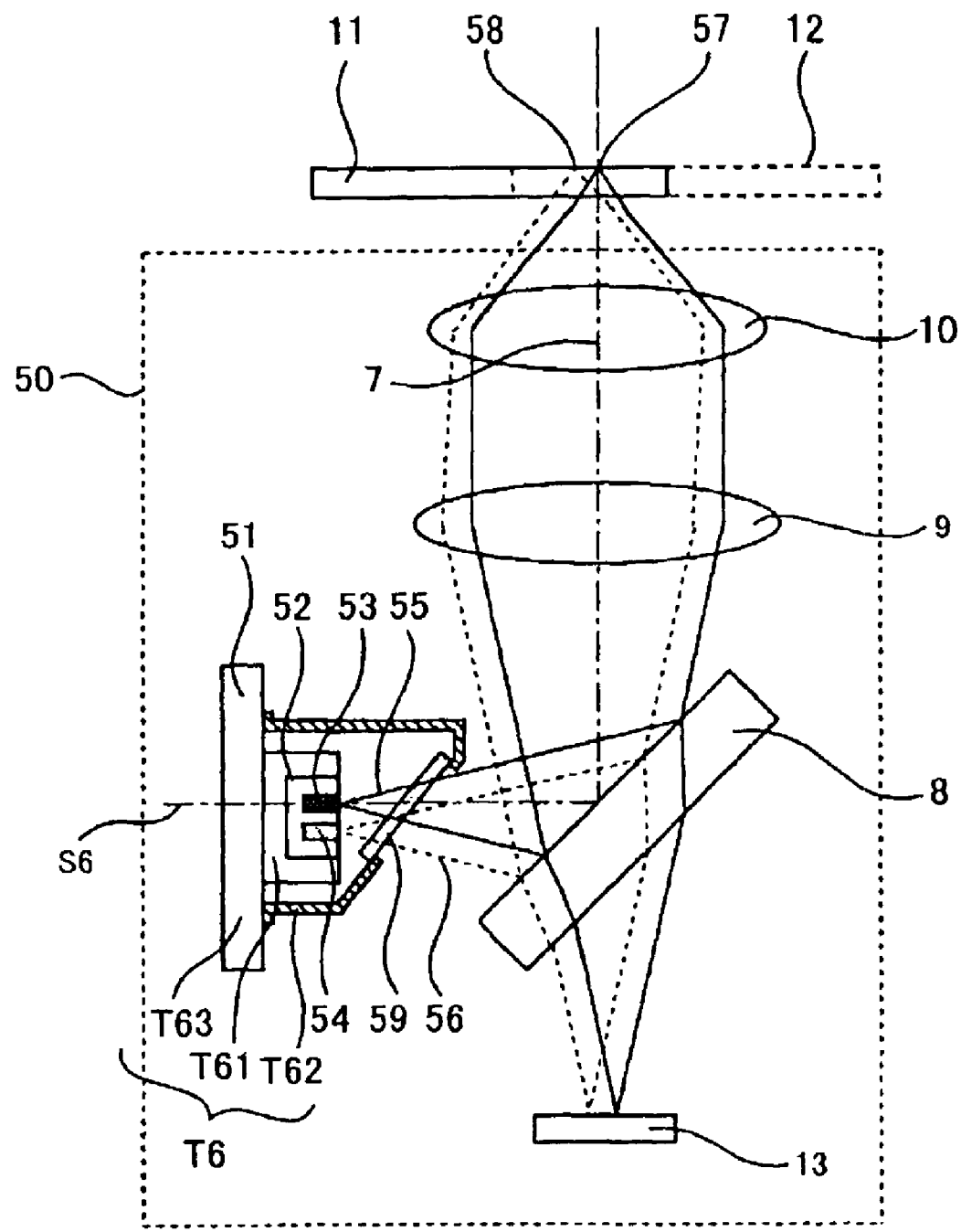
FIG. 9 is a structural view of a semiconductor laser unit and optical head device of Embodiment 6.
Figure 10:
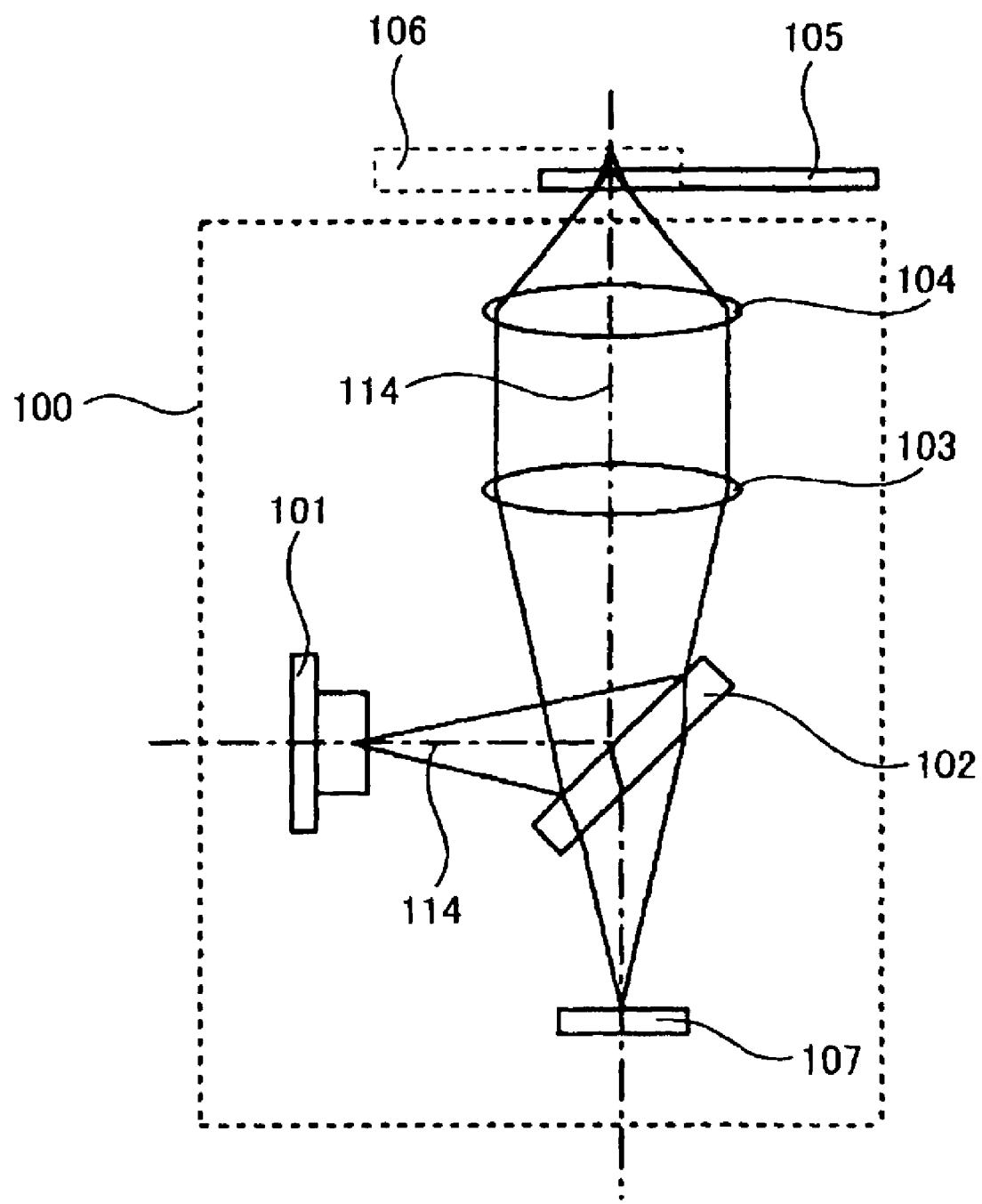
FIG. 10 is a structural view of a conventional, general optical head device.
Figure 11:
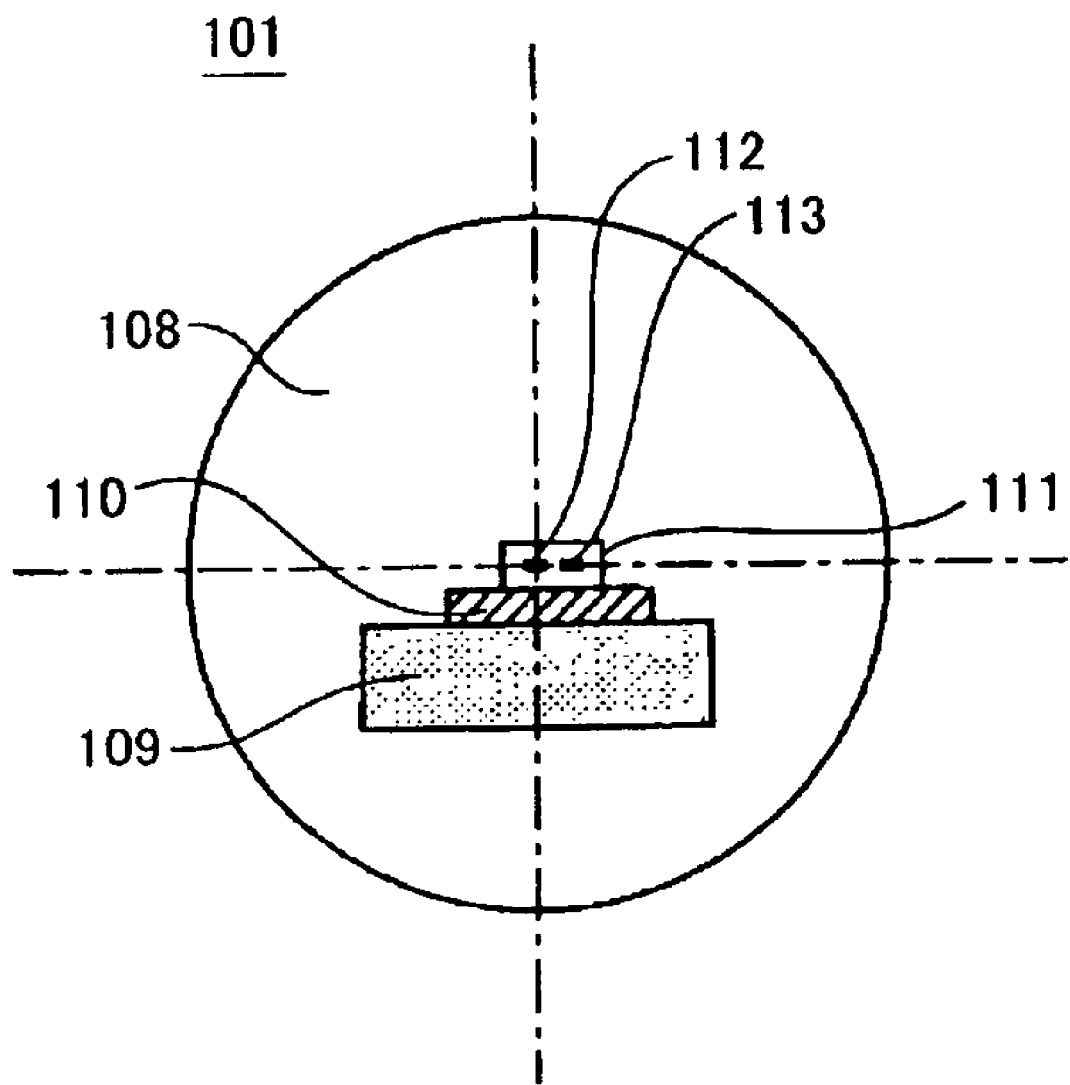
FIG. 11 is a sectional view of a conventional semiconductor laser unit in a first background art.
Figure 12:
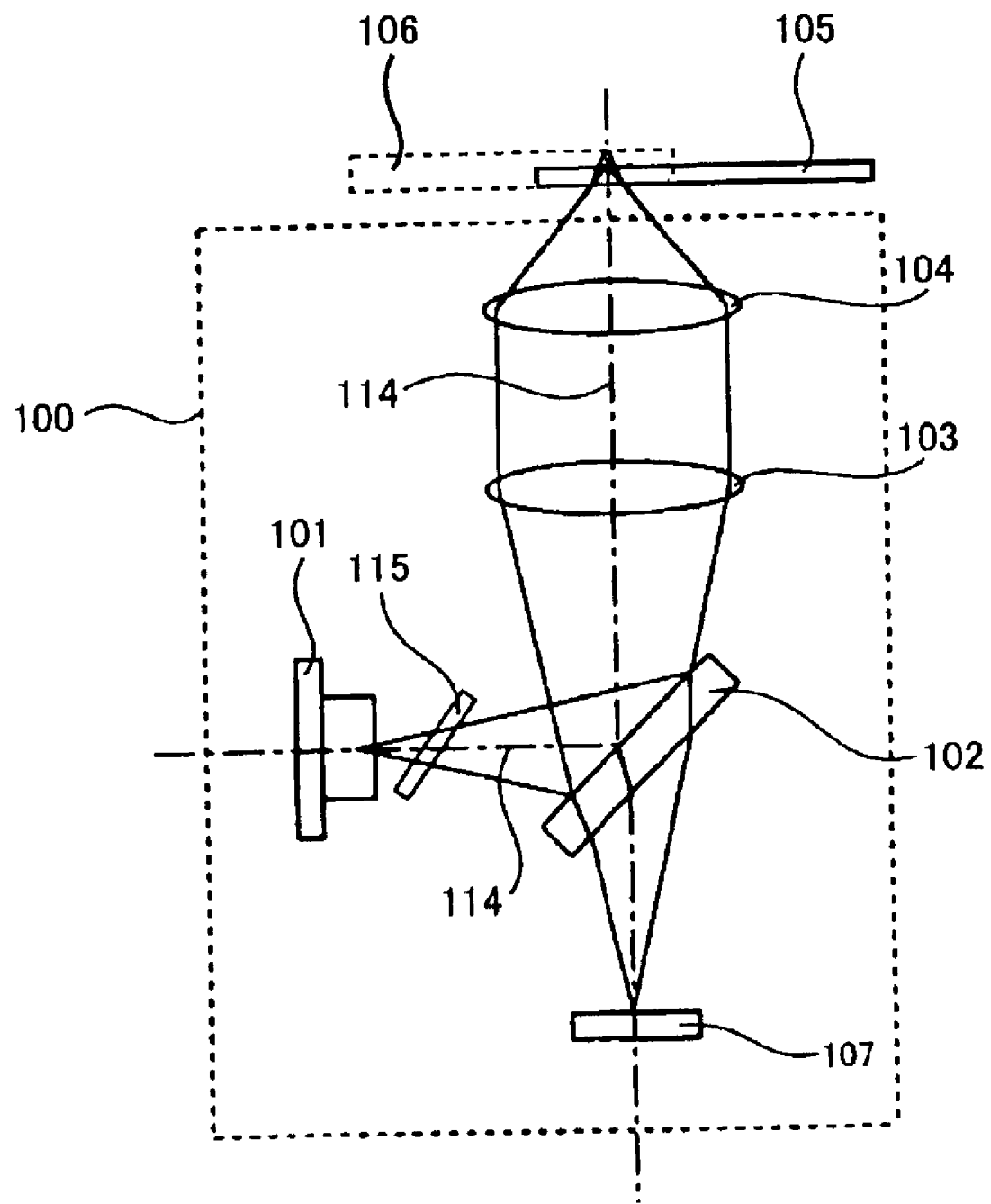
FIG. 12 is a structural view of a conventional optical head device in a third background art.
Figure 13:
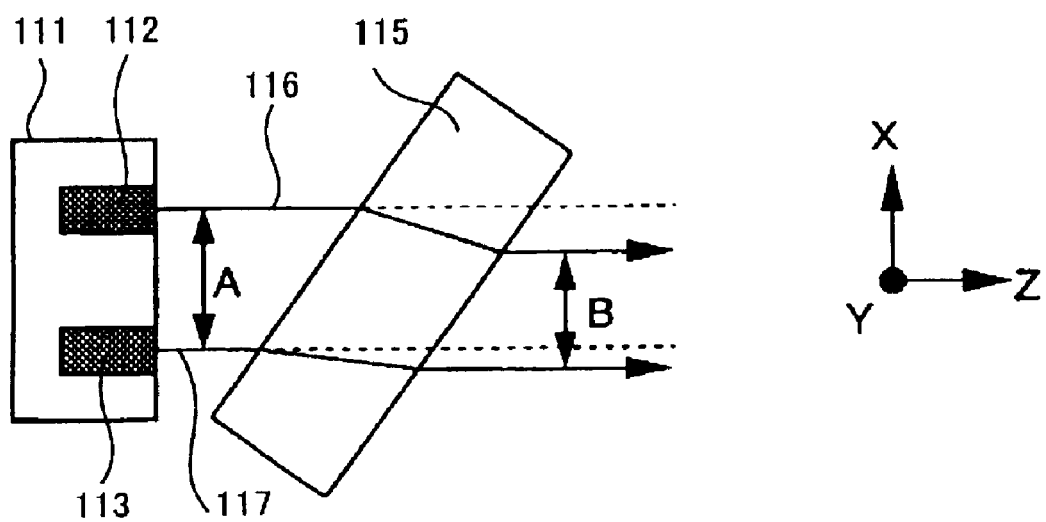
FIG. 13 is a structural view showing a relationship between a multi-beam semiconductor laser unit and a astigmatism compensating plate in a conventional optical head device.

In FIG. 9, references 7 to 13 are the same as those shown in FIG. 1. An optical head device 50 of Embodiment 6 includes a semiconductor laser unit 51 capable of emitting a plurality of laser beams, showing herein a unit mounted with a monolithically integrated multi-beam semiconductor laser unit 52. The multi-beam semiconductor laser unit 52 is structured by semiconductor laser elements 53 and 54 of the two semiconductor laser elements 53, 54, the semiconductor laser element 53 has an astigmatism greater than that of the semiconductor laser element 54.

Laser beams 55 and 56 are emitted from the semiconductor laser elements 53 and 54, respectively. The semiconductor laser elements 53, 54 structuring the multi-beam semiconductor laser unit 52 are arranged such that the laser beams 55, 56 are parallel with each other in a laser beam-emitting direction. A base T6 is for positioning and fixing the multi-beam semiconductor laser unit 52, and S6 is a reference axis of the base T6. A block T61 is for holding the multi-beam semiconductor laser unit 52, a case T62 for protecting the multi-beam semiconductor laser unit 52, and a stem T63 for fixing the block T61 and the case T62. The block T61, the case T62 and the stem T63 structure the base T6.

A cover glass 59 in a parallel plate form is fixed on the case T62 of the base T6, with inclination relative to the laser beam-emitting surface of the semiconductor laser elements 53, 54. The refractive index and thickness of the cover glass 59 and the inclination angle to the laser beam-emitting surface for laser beams 53, 54 are set to cancel the astigmatism inherently existing on the semiconductor laser element 53. The cover glass 59 may be a synthetic-resin light transmissive member besides a glass-made one provided that it can compensate the astigmatism on the semiconductor laser element 53 greater in astigmatism. It is possible to use a cylindrical lens, a hologram, a Fresnel lens, a coupling lens or the like.

The semiconductor laser elements 53, 54 are arranged such that the axis of the laser beam 55 emitted from the semiconductor laser element 53 greater in astigmatism, after transmitted through the cover glass 59, is coincident with the reference axis S6 of the base T6. The semiconductor laser unit 51 is defined in its outer shape such that the reference axis S6 of the base T6 is coincident with the optical axis 7 of the objective lens 10 or its extension axis. Accordingly, the multi-beam semiconductor laser unit 52 is arranged such that the laser beam 55 after transmitted through the cover glass 59 is coincident in its axis with the optical axis 7 of the objective lens 10.

The laser beams 55, 56 are focused at focal spots 57 and 58 on the optical disks 11, 12. In the case that the laser beam 55 emitted from the semiconductor laser element 53 greater in astigmatism is focused on the optical disk 11, the focal spot 57 is formed just on the optical axis 7 of the optical head device 50. On the other hand, in the case that a laser beam 56 emitted from the semiconductor laser element 54 smaller in astigmatism is focused on the optical disk 12, is formed a focal spot 58 having an image height.

Explanation will now be made on the operation of the optical head device 50 of Embodiment 6. The laser beams 55, 56 respectively emitted from the semiconductor laser elements 53, 54 transmit through the cover glass 59. The astigmatism existing on the semiconductor laser element 53 greater in astigmatism is canceled by transmission through the cover glass 59, to propagate a laser beam 55 compensated in astigmatism. Furthermore, the cover glass 59, together with the cover T62, serves to protect the multi-beam semiconductor laser unit 52 from dust and dirt or the oxygen in the air. Because the laser beam 55 after transmitted through the cover glass 59 is coincident in its axis with the optical axis 7 of the objective lens 10, it is focused without the influence of an image height characteristic of the objective lens 10, to form a focal spot 57. Namely, no astigmatism exists in the focal spot 57.

On the other hand, because the astigmatism existing on the semiconductor laser element 54 is smaller than the astigmatism existing on the semiconductor laser element 53, transmission through the cover glass 59 causes excessive cancellation of astigmatism to propagate a laser beam 56 newly given with an astigmatism reverse in direction to the original astigmatism. Because this laser beam 56 is not coincident in its axis with the optical axis 7 of the objective lens 10, it is focused having an image height characteristic by the objective lens 10, to form a focal spot 58. This focal spot 58 undergoes the effect of the astigmatism resulting from the image height characteristic of the objective lens 10 shown in FIG. 3, and this acts to cancel the reverse astigmatism existed in the laser beam 56. The degree of cancellation depends upon a magnitude of the astigmatism inherently possessed by the semiconductor laser element 54 and the image height characteristic of the objective lens 10. The cancellation is possible to nearly zero by adjusting this astigmatism, this image height characteristic, and other conditions. As a result, the two focal spots 57, 58 can be provided with astigmatisms not existing at the same time. It is possible to provide a favorable focusing characteristic.

In this manner, as for the laser beam 55 emitted from the semiconductor laser element 53 greater in astigmatism, the astigmatism is compensated through the cover glass 59. Furthermore, because the laser beam 55, after transmission through the cover glass 59, is propagated in an axis just on the optical axis 7, no astigmatism newly occurs. On the other hand, as for the laser beam 56 emitted from the semiconductor laser element 54 smaller in astigmatism, excessive compensation is made by the cover glass 59 to reverse the direction of astigmatism. Furthermore, because of propagation at a laser beam axis off the optical axis 7, an astigmatism newly occurs due to the image height characteristic of the objective lens 10. However, it is structurally possible to cancel between this astigmatism and the reverse astigmatism by the cover glass 59. Therefore, focusing characteristic evenness of the laser beams 55, 56 can be obtained.

Although Embodiment 6 shows the case of two semiconductor laser elements structuring the multi-beam semiconductor laser unit 52, they may be three or more in the number. In such a case, used is a cover glass for astigmatism compensation on the semiconductor laser element greatest in astigmatism among the semiconductor laser elements in plurality. Furthermore, the plurality of semiconductor laser elements are arranged such that the laser beam emitted from the semiconductor laser element greatest in astigmatism is coincident in its axis with the reference axis S6 of the base T6, i.e. with the optical axis 7 of the objective lens 10.

Embodiment 7

In the multi-beam semiconductor laser unit of each Embodiment 1 to 6, provided that arrangement of a plurality of semiconductor laser elements on a semiconductor laser unit or optical head device is made depending on a magnitude of astigmatism as noted above, there is no especial limitation in the relationship with the wavelength of each semiconductor laser element structuring a multi-beam semiconductor laser unit. It is satisfactory to emit laser beams of the same wavelength or different wavelengths. For example, where securing interchangeable use as a DVD and CD on the disks 11, 12, the semiconductor laser element corresponding to a DVD is to emit a laser beam at 650 nm, while the semiconductor laser element corresponding to the CD is to emit a laser beam at 780 nm. Also, for a case employing a multi-beam scheme or the like, used are a plurality of semiconductor laser elements for emission with the same wavelength.

As for the semiconductor laser elements, Embodiments 1 to 6 show use of the semiconductor laser elements monolithically integrated, and discrete laser elements may also be arranged.

In actually adopting a form from among the showing of Embodiments 1 to 6, it is possible to determine by taking into account a magnitude of astigmatism on the individual semiconductor laser element, required performance and so on.

The above explained preferred embodiments are exemplary of the present invention which is described solely by the claims below. It should be understood that modifications of the preferred embodiments may be made as would occur to one of skill in the art.

What is claimed is:

1. An optical head device for recording onto and/or reproducing from an optical medium, the optical head device comprising:

a plurality of semiconductor laser elements arranged parallel with one another in a laser beam-emitting direction;

an optical lens for irradiating laser beams emitted from the plurality of semiconductor laser elements onto the optical medium; and a photo-detector for detecting a laser beam irradiated onto the optical medium;

wherein the plurality of semiconductor laser elements are arranged such that a laser beam emitted from the semiconductor laser element greatest in astigmatism, of the plurality of semiconductor laser elements, is coincident in its axis with an optical axis of the optical lens.

2. An optical head device according to claim 1, wherein, between the plurality of semiconductor laser elements and the optical lens, a light transmissive member in a parallel plate form is further arranged in front of and parallel with a laser beam-emitting surface of the plurality of semiconductor laser elements.

3. An optical head device according to claim 1, wherein the plurality of semiconductor laser elements emit laser beams mutually same or different in wavelength.

4. An optical head device for recording onto and/or reproducing from an optical medium, the optical head device comprising:

a plurality of semiconductor laser elements arranged parallel with one another in a laser beam-emitting direction, at least two of the plurality of semiconductor laser elements having an astigmatism substantially equal with each other;

an optical lens for irradiating laser beams emitted from the plurality of semiconductor laser elements onto the optical medium; and a photo-detector for detecting a laser beam irradiated onto the optical medium;

wherein the plurality of semiconductor laser elements are arranged such that axes of laser beams emitted from the at least two semiconductor laser elements sandwich an optical axis of the optical lens and are spaced by a substantially equal distance from the optical axis.

5. An optical head device according to claim 4, wherein, between the plurality of semiconductor laser elements and the optical lens, a light transmissive member in a parallel plate form is further arranged in front of and parallel with a laser beam-emitting surface of the plurality of semiconductor laser elements.

6. An optical head device for recording onto and/or reproducing from an optical medium, the optical head device comprising:

a plurality of semiconductor laser elements arranged parallel with one another in a laser beam-emitting direction, at least two of the plurality of semiconductor laser elements having an astigmatism substantially equal with each other;

an astigmatism compensator arranged in front of a laser beam-emitting surface of the plurality of semiconductor laser elements, to compensate an astigmatism of the at least two semiconductor laser elements;

an optical lens for irradiating laser beams transmitted through the astigmatism compensator onto the optical medium; and a photo-detector for detecting a laser beam irradiated onto the optical medium;

wherein the plurality of semiconductor laser elements are arranged such that axes of laser beams emitted from the at least two semiconductor laser elements, after having transmitted through the astigmatism compensator, sandwich an optical axis of the optical lens and are spaced by a substantially equal distance from the optical axis.

7. An optical head device according to claim 6, wherein the astigmatism compensator is a light transmissive member in a parallel plate form arranged with inclination relative to the laser beam emitting surface of the plurality of semiconductor laser elements.

8. An optical head device for recording to and/or reproducing from an optical medium, the optical head device comprising:

a plurality of semiconductor laser elements arranged parallel with one another in a laser beam-emitting direction, the plurality of semiconductor laser elements comprising the first semiconductor laser element greatest in astigmatism and a second semiconductor laser element smaller in astigmatism than the first semiconductor laser element;

an astigmatism compensator arranged in front of a laser beam emitting surface of the plurality of semiconductor laser elements, to compensate astigmatism of the second semiconductor laser element;

an optical lens for irradiating a laser beam transmitted through the astigmatism compensator onto the optical medium; and a photo-detector for detecting a laser beam irradiated onto the optical medium;

wherein the plurality of semiconductor laser elements are arranged such that a laser beam emitted from the first semiconductor laser element, after having transmitted through the astigmatism compensator, is coincident in its axis with an optical axis of the optical lens.

9. An optical head device for recording to and/or reproducing from an optical medium, the optical head device comprising:

a plurality of semiconductor laser elements arranged parallel with one another in a laser beam-emitting direction, the plurality of semiconductor laser elements comprising the first semiconductor laser element greatest in astigmatism and a second semiconductor laser element smaller in astigmatism than the first semiconductor laser element;

an astigmatism compensator arranged in front of a laser beam emitting surface of the plurality of semiconductor laser elements, to compensate astigmatism of the first semiconductor laser element;

an optical lens for irradiating a laser beam transmitted through the astigmatism compensator onto the optical medium; and a photo-detector for detecting a laser beam irradiated onto the optical medium;

wherein the plurality of semiconductor laser elements are arranged such that a laser beam emitted from the first semiconductor laser element, after having transmitted through the astigmatism compensator, is coincident in its axis with an optical axis of the optical lens.

10. An optical head device for recording onto and/or reproducing from an optical medium, the optical head device comprising:

a plurality of semiconductor laser elements arranged parallel with one another in a laser beam-emitting direction;

an optical lens for irradiating laser beams emitted from the plurality of semiconductor laser elements onto the optical medium; and a photo-detector for detecting a laser beam irradiated onto the optical medium, wherein the plurality of semiconductor laser elements are arranged so as to equalize each of a magnitude of astigmatism which is given by combining an astigmatism inherently existing on each of the semiconductor laser elements with an astigmatism occurring due to an image height characteristic of the optical lens.

11. An optical head device for recording to and/or reproducing from an optical medium, the optical head device comprising:

a plurality of semiconductor laser elements arranged parallel with one another in a laser beam-emitting direction, the plurality of semiconductor laser elements comprising the first semiconductor laser element greatest in astigmatism and a second semiconductor laser element smaller in astigmatism than the first semiconductor laser element;

an astigmatism compensator arranged in front of a laser beam emitting surface of the plurality of semiconductor laser elements, to compensate astigmatism of the first semiconductor laser element;

an optical lens for irradiating a laser beam transmitted through the astigmatism compensator onto the optical medium; and a photo-detector for detecting a laser beam irradiated onto the optical medium, wherein the plurality of semiconductor laser elements are arranged so as to equalize each of a magnitude of astigmatism which is given by combining an astigmatism existing on a laser beam emitted from each of the semiconductor laser elements, after having transmitted through the astigmatism compensator, with an astigmatism occurring due to image-height characteristic of the optical lens.

* * * * *